United States Patent [19]

Smith

[11] Patent Number: 5,530,927
[45] Date of Patent: Jun. 25, 1996

[54] DOUBLY BALANCED SUPERCONDUCTIVE MIXER NETWORK

[75] Inventor: Andrew D. Smith, Redondo Beach, Calif.

[73] Assignee: The United States of America as represented by the Secretary of the Air Force, Washington, D.C.

[21] Appl. No.: 272,916

[22] Filed: Jul. 1, 1994

[51] Int. Cl.⁶ ..................................... H04B 1/10
[52] U.S. Cl. .......................... 455/317; 455/323; 455/326; 333/99 S; 505/204; 505/210
[58] Field of Search ..................... 455/323, 325, 455/327, 333, 326, 319, 333, 505; 343/795, 753; 333/117, 99 S; 505/200, 201, 202, 203, 204, 205, 210

[56] References Cited

U.S. PATENT DOCUMENTS

| | | | |
|---|---|---|---|
| 3,350,649 | 10/1967 | Blaeser | 325/449 |
| 3,621,400 | 11/1971 | Paciorek et al. | 325/446 |
| 3,737,686 | 6/1973 | Swanekamp et al. | 235/194 |
| 4,298,990 | 11/1981 | Bielska-Lewandowska et al. | 455/325 |
| 4,325,144 | 4/1982 | Slusky et al. | 455/324 |
| 4,344,052 | 8/1982 | Davidson | 333/222 |
| 4,603,435 | 7/1986 | Butler | 455/319 |
| 4,731,875 | 3/1988 | Mizukami et al. | 455/302 |
| 4,749,888 | 6/1988 | Sakai et al. | 307/476 |
| 4,896,374 | 1/1990 | Waugh et al. | 455/326 |
| 4,955,085 | 9/1990 | Woody | 455/330 |
| 5,114,912 | 5/1992 | Benz | 505/1 |
| 5,339,457 | 8/1994 | Kawasaki et al. | 455/333 |

*Primary Examiner*—Reinhard J. Eisenzopf
*Assistant Examiner*—Lee Nguyen
*Attorney, Agent, or Firm*—William G. Auton

[57] ABSTRACT

A feed network parallel superconductive tunnel junction circuit that acts as a doubly balanced mixer and can be utilized as a millimeter wave satellite communications link. A quadrature-fed mixer circuit relies on a network of 90 degree couplers to feed signal and local oscillator power to four identical SIS detectors where SIS is a superconductor-insulator-superconductor layer construction. Power applied to either port is split equally to each detector, and the relative phase relationship of the signal and the LO is preserved. By selecting the appropriate polarity of the dc junction bias, the detected IF output of the SIS detectors adds coherently.

1 Claim, 3 Drawing Sheets

100 GHz DETECTION

DOUBLY BALANCED SUPERCONDUCTIVE MIXER NETWORK

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to superconductor circuits, and more specifically the invention pertains to a feed network/parallel superconductive tunnel junction circuit that acts as a doubly balanced mixer and can be utilized as a millimeter wave satellite communications link.

The present invention was developed to help demonstrate a monolithic low noise superconductive coherent receiver which could serve as a prototype for the terahertz frequency range. The essential components of the monolithic heterodyne receiver are an antenna, preamplifier, heterodyne detector consisting of the mixer and local oscillator, and an intermediate frequency (IF) or baseband amplifier.

The spectral region from 100–1000 GHz has applications for passive and active surveillance and discrimination, and secure, wideband space communications. Low atmospheric absorption bands at 94, 140, and 220 GHz provide cloud-penetrating windows for passive or active surveillance of terrestrial targets. At other frequencies, such as 120 and 180 GHz, the extremely opaque atmosphere shields from earth-based jamming of satellite-to-satellite communications. Compared to microwave-based systems, the submillimeter wavelengths offer ten to hundred-fold decrease in antenna size and system weight while improving angular resolution, key considerations for space-based systems.

Previous exploitation of this band has been nearly impossible because of a lack of device technology. Semiconductor devices, most notably gallium arsenide and waveguide-based packages degrade rapidly at short wavelengths. Superconductive devices have shown potential for high frequency operation, but incompatibilities in temperature, impedance, and power level have limited the use of superconductors with semiconductor equipment.

Recent years have seen very rapid progress in the field of cryoelectronics. In particular, superconductor devices, with their high speed and low power dissipation, have come to show great promise as future digital devices in communications links.

Prior art superconductive mixers have been single ended, with signal and local oscillator power externally combined and sent to waveguide - mounted mixer diodes. At mm-wave frequencies (100 Ghz), mixers are often starved for local oscillator (L.O.) power, causing poor conversion efficiency. Standard "single-ended" designs intentionally waste local oscillator power by weak L.O. coupling in order to maximize signal coupling and prevent signal from corrupting the L.O. source.

The task of providing a feed network/parallel superconductive tunnel junction circuit that acts as a doubly balanced mixer, is alleviated, to some extent, by the systems disclosed in the following U.S. Patents, the disclosures of which are incorporated herein by reference:

U.S. Pat. No. 3,350,649 issued to Blaeser;
U.S. Pat. No. 3,621,400 issued to Paciorek;
U.S. Pat. No. 4,298,990 Issued to Bielska-Lewandowska;
U.S. Pat. No. 4,325,144 issued to Slusky et al;
U.S. Pat. No. 4,344,052 issued to Davidson;
U.S. Pat. No. 4,731,875 Issued to Mizukami et al;
U.S. Pat. No. 4,749,888 issued to Sakai et al;
U.S. Pat. No. 4,896,374 issued to Waugh et al; and
U.S. Pat. No. 4,955,085 issued to Woody.

Blaeser discloses a frequency converter utilizing a microstrip line and a tunnel diode. The type of tunnel diode is not disclosed.

Paciorek discloses an ac signal-combining apparatus, wherein a plurality of 3 db couplers interconnect two signal sources to a signal utilization device. Several examples of mixers and modulators are disclosed.

Bielska-Lewandowska et al disclose a frequency converter in the mm and sub-mm wavelength range utilizing Josephson junctions of either a superconducting bridge type or a tunneling type.

Slusky et al discloses a hysteretic SIS junction mixer wherein the hysteretic nature of the junction allows the mixer to operate in a switching mode, thereby producing low-noise mixing with gain.

Davidson discloses a distributed array of Josephson devices having coherence. The Josephson devices can be point contacts, micro bridges, weak links, and tunnel junctions. When utilized as a tunnel junction J2, J3 and J4, they comprise two electrodes separated by a thin tunnel barrier. It is constructed as an SIS device wherein the ground plane has a layer of electrical insulation located thereover. On this is deposited a superconductor which is one electrode. The other electrode is the superconductor layer. A thin tunnel barrier is formed between the electrodes of each of the tunnel diodes J2–J4.

Mizukami et al disclose a frequency converter used for a receiver which receives signals in the UHF bank or a microwave band. It includes two mixer circuits and a hybrid coupler. At least two embodiments are disclosed.

Sakai et al disclose a Josephson transmission line device consisting of a pair of two superconducting layers and a junction layer disposed between the superconducting layers (SIS type). A number of preferred embodiments are disclosed.

Waugh et al disclose a broadband monolithic balanced mixer apparatus employing a unidirectional active 180 degree hybrid. Matching networks are used at all four ports of the active hybrid to achieve the desired match over the desired frequency ranges.

Woody discloses a series RF/Parallel IF mixer array utilizing SIS tunnelling junction mixer elements in heterodyne receivers such as used in radio astronomy.

The above-cited references are indicative of the ongoing need to improve superconductive mixer circuits conversion efficiency and signal coupling properties. The present invention is intended to satisfy that need.

SUMMARY OF THE INVENTION

The present invention includes a feed network/parallel superconductive tunnel junction circuit that acts as a doubly balanced mixer and can be utilized as a millimeter wave satellite communications link. A quadrature-fed mixer circuit relies on a network of 90 degree couplers to feed signal and local oscillator power to four identical SIS detectors where SIS is superconductor-insulator-superconductor layer construction. Power applied to either port is split equally to each detector, and the relative phase relationship of the signal and the LO is preserved. By selecting the appropriate polarity of the dc junction bias, the detected IF output of the SIS detectors adds coherently.

One embodiment of the present invention is a superconductive mixer network that downconverts 100–1,000 GHz RF signals into 30–60 MHz intermediate frequency signals using: a local oscillator, four 90 degree hybrid coupler elements, four superconductor-insulator—superconductor mixer elements, two terminating loads, an IF power combiner, and a DC bias source. All of the coupler elements have two input terminals and to output terminals, and output signals by equally splitting signals they receive. The first coupler element is connected to an RF antenna to receive, split and output the RF signals received therefrom. The second coupler element is connected to the local oscillator in order to receive, split and output the local oscillator signal received therefrom.

The third and fourth coupler elements each have their first and second input terminals connected to the first and second output terminals of the first and second coupler elements, to output sets of coupled signals containing both the RF and local oscillator (LO) signals.

The four mixer elements are each electrically connected to one of the output terminals of the third and fourth coupler elements and to the DC bias source to mix thereby the RF and LO signals and produce sets of intermediate frequency signals.

The IF power combiner receives and combines the sets of IF signals from each of the four mixer elements to output thereby a combined set of IF signals.

The second input terminals of the first and second coupler elements is electrically connected to the two terminating loads which drains off reflected signals produced in the mixer network. This prevents the reflected signals from contaminating the local oscillator signals.

It is an object of the present invention to improve the conversion efficiency and signal coupling properties of superconductive mixer circuits.

It is another object of the present invention to provide a feed network/parallel superconductive tunnel junction circuit that acts as a doubly balanced mixer.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a feed network/parallel superconductive tunnel junction circuit that acts as a doubly balanced mixer and can be utilized as a millimeter wave satellite communications link. As mentioned above, the present invention was developed to help demonstrate a monolithic low noise superconductive coherent receiver which could serve as a prototype for the entire terahertz frequency range. The essential components of the monolithic heterodyne receiver are an antenna, preamplifier, heterodyne detector consisting of the mixer and local oscillator, and an intermediate frequency (IF) or baseband amplifier. These elements are shown in FIG. 1, and described briefly below.

Figure 1:
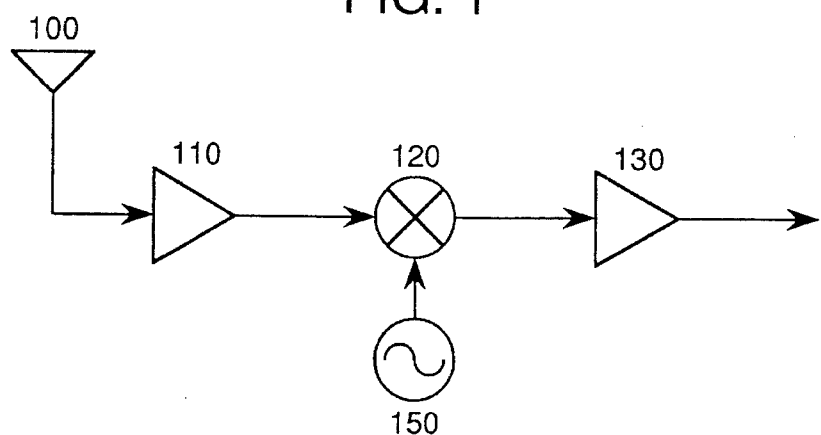
FIG. 1 is a block diagram of the broad elements of a communication system that uses the present invention.

FIG. 1 is a simplified diagram of the broad elements of a communication system that uses the present invention. The antenna 100 receives radio frequency (RF) signals in the spectral region from 100–1,000 GHz and conducts them to the preamplifier 110. The preamplifier 110 amplifies the relatively faint RF signals to reduce noise in the mixing process. The local oscillator 150 outputs a local oscillator signal.

The mixer element 120 of FIG. 1 designates a frequency down conversion circuit which receives and downconverts the amplified RF signal from the preamplifier 110 by mixing it with the local oscillator signal from the local oscillator, and produce thereby an intermediate frequency (IF) signal from the IF amplifier 130. The intermediate frequency signal can range from KHz to GHz.

Figure 2:
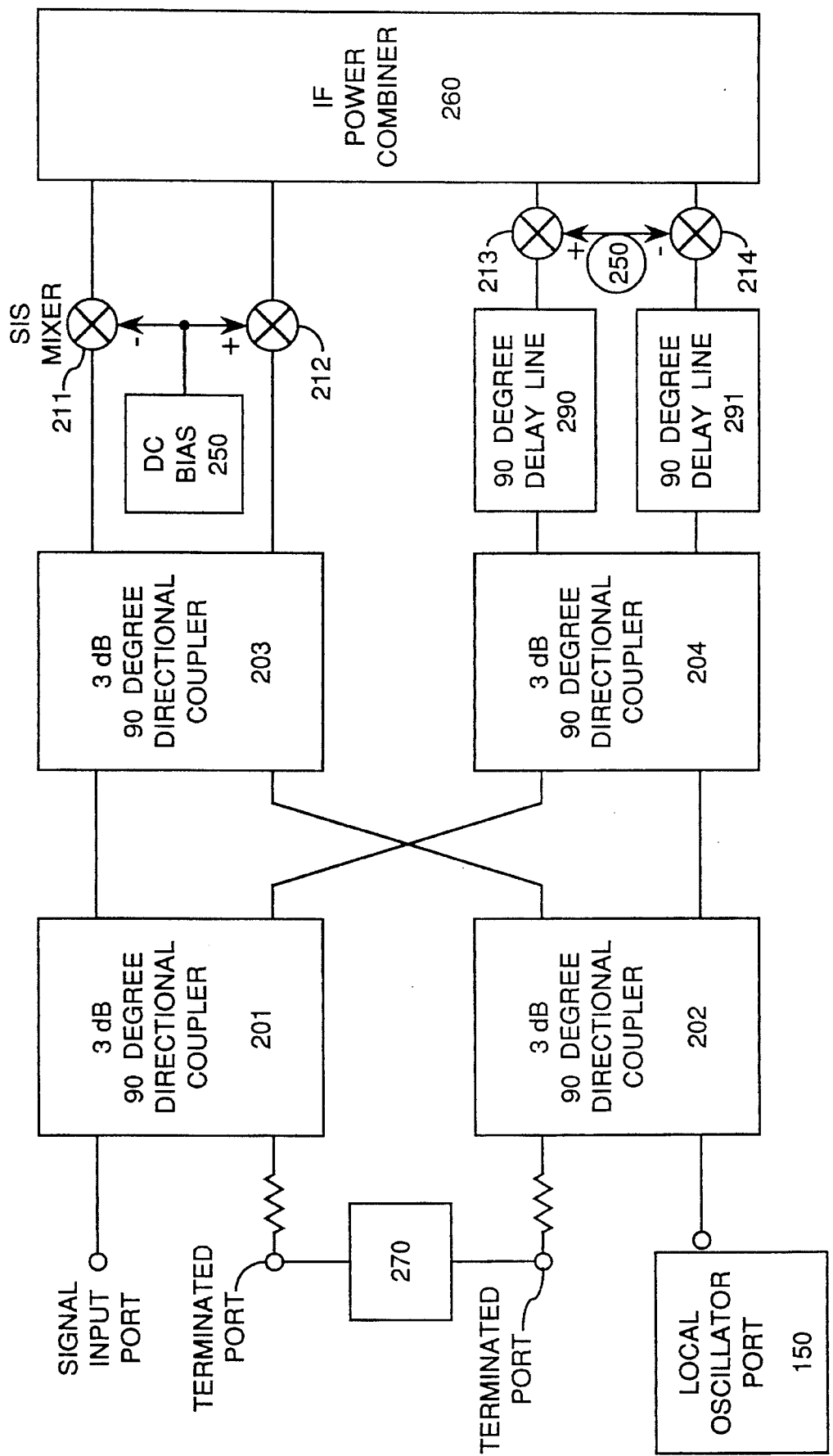
FIG. 2 is a block diagram of the preferred embodiment of the present invention.

The principles of frequency downconversion are discussed in the cited references, and in the "Radar Handbook" by M. Skolnik, the disclosure of which is incorporated herein by reference. FIG. 2 is the double balanced superconducting mixer network of the present invention, which serves as the mixer element 120 in the diagram of FIG. 1.

Note that the heterodyne receiver system of FIG. 1 is the subject of a separate patent application entitled "Integrated Superconductive Heterodyne Receiver" Ser. No. 08/269, 711, filed Jul. 1, 1994 by A. D. Smith, the disclosure of which is incorporated herein by reference.

The superconductive mixer network of FIG. 2 performs frequency downconversion of signals using: four 90 degree hybrid couplers 201–204, four SIS mixers 211–214, a local oscillator 150, a DC bias polarity source 250, a 90 degree delay line 200, an IF power combiner 260, and termination loads 270.

Each of the 90 degree hybrid couplers serves to split received inputs equally over a pair of output ports. The first hybrid coupler 201 receives the RF signals from the antenna 100 and preamplifier 100 of FIG. 1, and splits them to provide inputs to the third and fourth hybrid couplers 203 and 204.

The second hybrid coupler 202 splits the local oscillator signal from the local oscillator 150, and provides split local oscillator signals to the third and fourth hybrid couplers 203 and 204.

The third hybrid coupler 203 has two output ports that are connected by in-phase lines to the first and second SIS mixers 211 and 212. Each of the two mixers 211 and 212 receives a combined signal that contains the split RF signal (from the first hybrid coupler 201) and the split local oscillator signal (from the second hybrid coupler 202). The fourth hybrid coupler 204 outputs the same type of signals as the third hybrid coupler 203, but they are delayed by a 90 degree delay line to produce quadrature combined signals for the third and fourth mixers 213 and 214.

The termination loads 270 are connected to the first and second hybrid couplers 201 and 202 in order to receive and absorb reflected signals therefrom. Note that the termination loads do not output any signals to the hybrid couplers 201 and 202, but serve only as a means for eliminating reflections received by these couplers from the third and fourth hybrid couplers 203 and 204. A variety of elements exists that can serve as termination loads, such as a long lossy transmission line, or a matching resistive load which connects on input port of the first two hybrid couplers 201 and 202 the ground plane.

Each of the SIS mixers 211–214 receives inputs from the third and fourth couplers 203 and 204 and the DC bias polarity source 250 to output thereby a downconverted IF signal that represents the signal characteristics of the RF signal received by the antenna 100 of FIG. 1. Also, the relative phase of the signal and local oscillator is preserved (modular 180) degrees) as shown in FIG. 2. By selecting the appropriate polarity of the dc junction bias, the detected intermediate frequency output of the SIS detectors adds coherently. The quadrature-fed mixer scheme insures maximum conversion efficiency.

Isolation and return loss are both high for the quadrature-fed method. Significant reflections from the SIS mixers are anticipated. The 90 degree coupler network acts to cancel reflections which would otherwise return out the input ports. Reflected power is dumped into the terminations, squelching potential feedback problems.

As mentioned above, the challenge of the present invention is to help the integration of antenna, amplifier, mixer, and oscillator circuits while maintaining high performance from each subcircuit. The superconducting circuit blocks are proving to be well suited for millimeter and sub-millimeter wave circuits. The high frequencies and low power levels of these circuits, however, make testing and characterization nearly impossible using conventional test equipment. Fortunately, the difficulties which plague conventional, off-chip testing can be overcome using superconducting, on-chip test circuitry. Successful operation of an integrated receiver also requires low loss matching between circuit blocks while efficiently blocking interference signals, such as local oscillator of pump power between stages. These coupling tasks are made even more challenging by the nearly complete lack of test equipment in the terahertz frequency range, the extremely low signal power signal power levels involved, and the uncertainties in coupling signals to off-chip test equipment. The circuits operate at picowatt power levels, with sensitivities far greater than conventional semiconductor test equipment, and downconvert signals with frequencies of up to about 400 GHz.

Heterodyne downconversion from the signal frequency to a more useable intermediate frequency (IF) is accomplished using the present invention. The premier mixer for 100–500 GHz, at least in high sensitivity applications, is the superconducting tunnel junction mixer. This mixer is also known as an SIS mixer, after its Superconductor-Insulator-Superconductor structure.

A limitation in previous SIS mixers is their single-ended, unbalanced design. A power combiner introduces both signal and local oscillator power into the same input line leading to the mixer. Except for narrowband application, the act of combining power into a single transmission line causes inefficiency. Scattering theory limits the total of the local oscillator and signal efficiency to 100 percent. Therefore an architecture which is 90 percent efficient in coupling signal power to the mixer must be only 10 percent efficient in its use of local oscillator power. This waste of power is unacceptable in the terahertz receiver due to the low power available from the 100 GHz superconductive oscillators.

A second problem of single-ended SIS mixers involves isolation. Because single ended mixers share a common input line between the signal and local oscillator, reflections off the mixer element can couple signal tones into the local oscillator. The local oscillator can easily be influenced by the signal power. In the worst case, a strong signal can phase-lock the oscillator.

The present invention overcame the efficiency and isolation difficulties in single ended mixers by going to a double balanced, ortho-quad geometry. By using a series of directional couplers and four separate SIS mixers, we were able to build a mixer capable of achieving 100 percent efficiency in coupling to both the signal and local oscillator. (Actually, each mixer couples with equal −6 dB (25%) efficiency to each of four identical input ports. By taking a coherent sum of four output port mixers, full 100 percent mixing efficiency for difference signals is recovered).

The mixer geometry, shown in FIG. 2 relies on coherent signal phasing provided in a cascade of directional couplers. The system has four input ports (on the left), two of which are terminated with load resistors. Input power from the remaining two ports is split by the first pair of 3 dB, 90 degree directional couplers, and split again by the second pair of couplers. The second pair of directional couplers also cross-combines power from the signal and local oscillator paths. For ideal 3 dB couplers, each mixer element is presented with 25 percent of the incident local oscillator and signal power.

Figure 3:
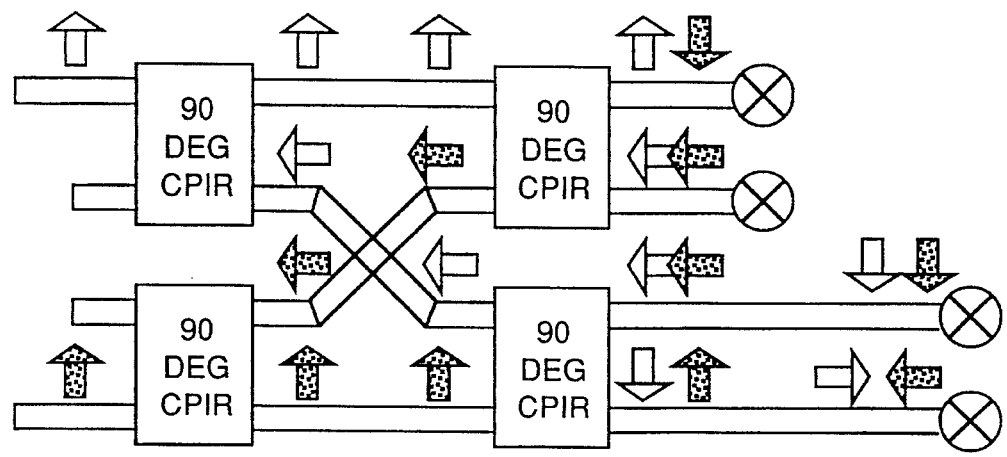
FIG. 3 is a vector diagram showing the combination of power from the RF signals and the local oscillator signals in the system of FIG. 2.

FIG. 3 is a vector diagram showing combination of power from the signal (open arrow) and local oscillator (filled arrow) ports. Phase delay in traversing the couplers is shown as counter-clockwise rotation. After traversing the network, signal and local oscillator power maintains phase coherence, with either purely constructive or destructive orientations. No quadrature (right angle) vector components are introduced.

Because mixers are sensitive to only one phase of the signal, coherent mixer operation requires careful attention to the relative phase of the signal and local oscillator. The network of 90 degree couplers is chosen to preserve the phase relationship between the signal and the image. Arrows in FIG. 3 depict the progression of local oscillator and signal phase as a result of traversing the couplers. At the mixer ports, the signal and image phasors are collinear, with no quadrature component. This form of coherency allows a vector sum of the outputs to produce an IF output without degradation in mixer conversion efficiency or noise level compared to individual mixers.

Figure 4:
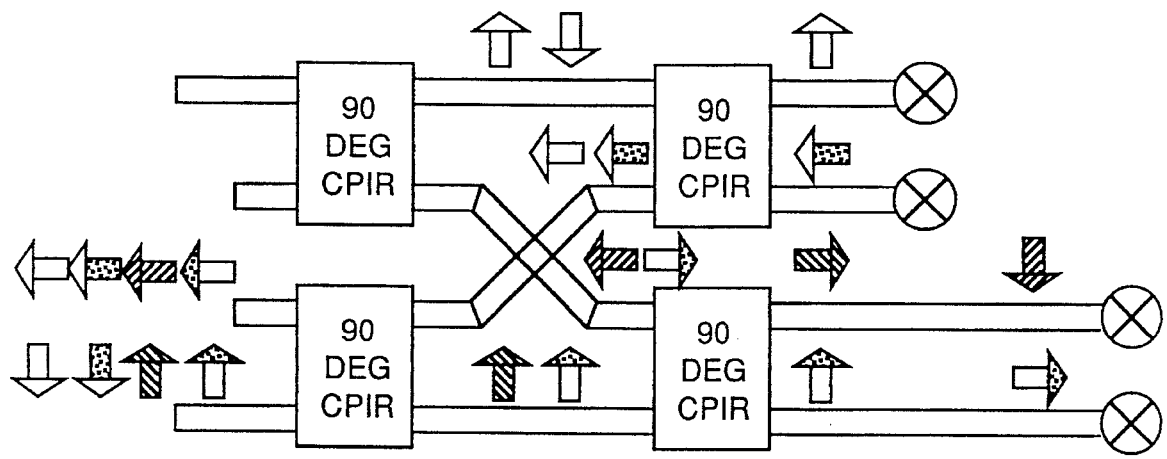
FIG. 4 is a vector diagram which shows the isolation of reflected signal power in the system of FIG. 2.

FIG. 4 is a vector diagram showing isolation of reflected signal power. Signal power reflecting equally from the four SIS mixer channels, with phase as shown in FIG. 3 will destructively combine into all input channels except for one of the terminated ports.

The combining network also introduces signal/local oscillator isolation. The main source of power transfer between the signal and image ports is due to reflections from the SIS mixers. FIG. 4 extends the phasor analysis from the previous diagram to show the effect of reflected power from the mixers. Provided the mixer reflections are identical, any local oscillator power reflection from the mixers adds with destructive interference into all of the input ports except one of the termination. Similar analysis holds for signal power. Thus reflected power from the SIS mixers is destroyed harmlessly in the terminations.

Figure 5:
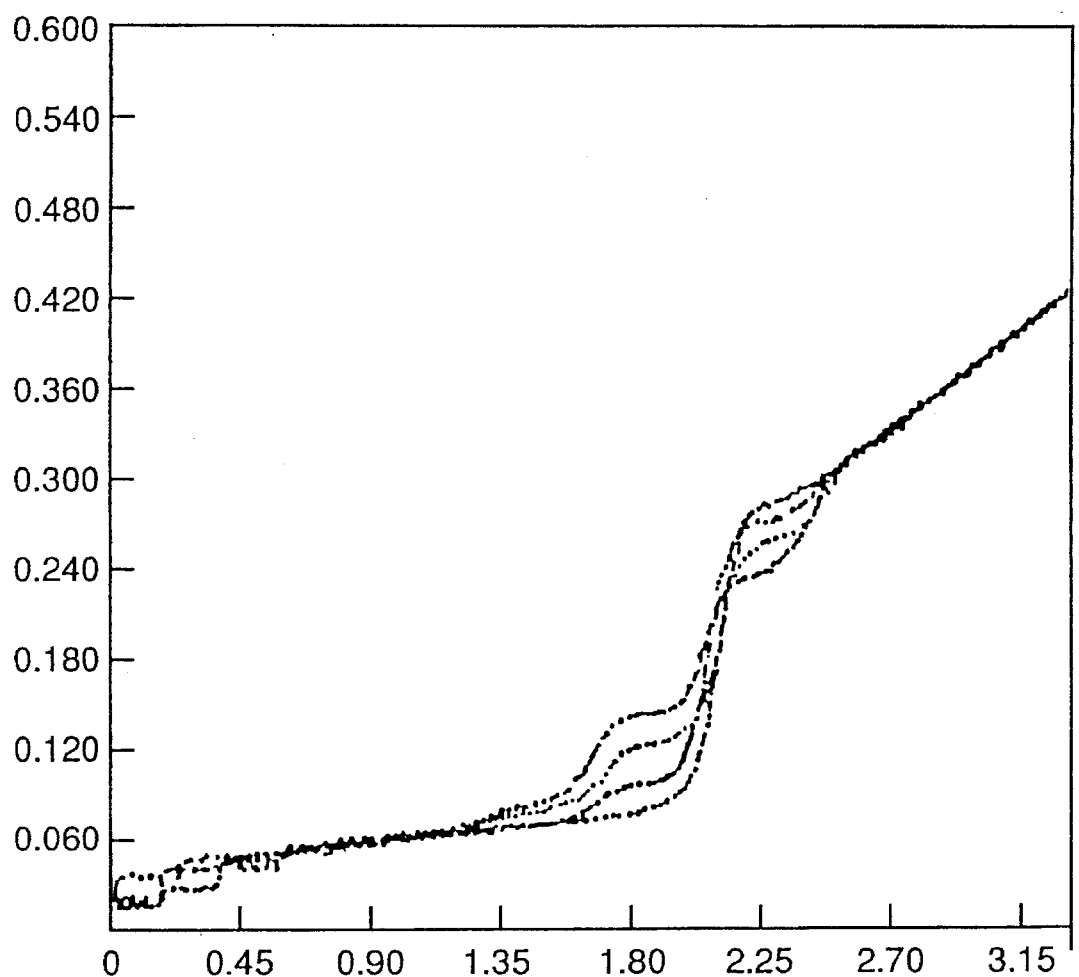
FIG. 5 is a chart of SIS mixer current and voltage characteristics.

FIG. 5 is a chart of SIS mixer current-voltage characteristics. Strong photon-assisted tunneling steps are apparent around the current rise of the gap. The high dynamic resistance on the steps is indicative of high mixer gain.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A superconductive mixer network which down converts radio frequency signals, said superconductive mixer network comprising:

a means for accepting local oscillator signals and radio frequency signals;

first, second, third and fourth coupler elements, each having first and second input terminals and first and second output terminals, said first coupler element receiving said radio frequency signals over its first input terminal and splitting the radio frequency signals to output them over its first and second output terminals;

said second coupler element receiving said local oscillator signals over its first and second input terminals and splitting the local oscillator signals to output them over its first and second output terminals to said third and fourth coupler elements;

said third and fourth coupler elements each having their first and second input terminals respectively connected to the first and second output terminals of the first and second coupler elements to receive said radio frequency signals and said local oscillator signals therefrom, said third and fourth coupler elements outputting sets of coupled signals over their first and second output terminals; and a means for mixing the sets of coupled signals from the third and fourth coupler elements to output thereby said sets of intermediate frequency signals, wherein said first, second, third and fourth coupler elements each comprise a 3 dB ninety degree directional coupler;

an intermediate frequency power combiner which combines and amplifies said intermediate frequency signals from said mixer network to output thereby said combined set of intermediate frequency signals;

a means for draining said reflected signals from said mixer network so that said reflected signals do not contaminate the local oscillator signals from said accepting means, wherein said draining means comprises a current load which is electrically connected to the second input terminals of said first and second coupler elements to drain said reflected signals therefrom;

first and second mixer elements which are respectively connected to the first and second output terminals of said third coupler element, to receive and mix said local oscillator signals with said radio frequency signals, and producing said sets of intermediate frequency signals thereby;

third and fourth mixer elements which are respectively connected to the first and second output terminals of said fourth coupler element, to receive and mix said local oscillator signals with said radio frequency signals and producing said sets of intermediate frequency signals thereby, wherein said first, second, third and fourth mixer elements each comprise a superconductor-insulator-superconductor mixer;

a first and second ninety degree delay line which respectively connect said third and fourth mixer elements to the first and second output terminals of said fourth coupler element; and a means for providing a D.C. bias current to said first, second, third and fourth mixer elements.

* * * * *